United States Patent [19]

Lijewski et al.

[11] 4,075,485

[45] Feb. 21, 1978

[54] APPARATUS FOR CONTROLLING AND DISPLAYING SCINTILLATION CAMERA INFORMATION

[75] Inventors: Robert R. Lijewski, Milwaukee; Ernest J. Wiesen, Wauwatosa, both of Wis.

[73] Assignee: General Electric Company, Milwaukee, Wis.

[21] Appl. No.: 683,732

[22] Filed: May 6, 1976

[51] Int. Cl.² .............................................. G01T 1/20
[52] U.S. Cl. ................................ 250/369; 250/363 R; 315/31 TV
[58] Field of Search ...................... 250/366, 363, 369; 315/403, 384, 31 TV

[56] References Cited

U.S. PATENT DOCUMENTS

| 2,458,891 | 1/1949 | Boyle | 315/31 TV |
| 3,401,301 | 9/1968 | Swaine et al. | 315/31 TV |
| 3,573,458 | 4/1971 | Anger | 250/366 |
| 3,801,858 | 4/1974 | Grangaard et al. | 315/403 |
| 3,852,602 | 12/1974 | Gramm | 250/363 S |
| 3,887,842 | 6/1975 | Owens et al. | 315/397 |
| 3,983,452 | 9/1976 | Bazin | 315/397 |

*Primary Examiner*—Harold A. Dixon
*Attorney, Agent, or Firm*—Ralph G. Hohenfeldt

[57] ABSTRACT

A cathode ray tube for displaying images corresponding with isotope radiation emissions uses electrostatic focusing means, magnetic deflection means and a fast amplifier for driving the deflection coils. Power supply voltages for the amplifier are programmable in correspondance with selected image size. Means for correcting focus within image areas, means for compensating the effects of tube aging and means for protecting against deflection failure are provided. Means for displaying visual indications of the status of the image making sequence are provided.

18 Claims, 12 Drawing Figures

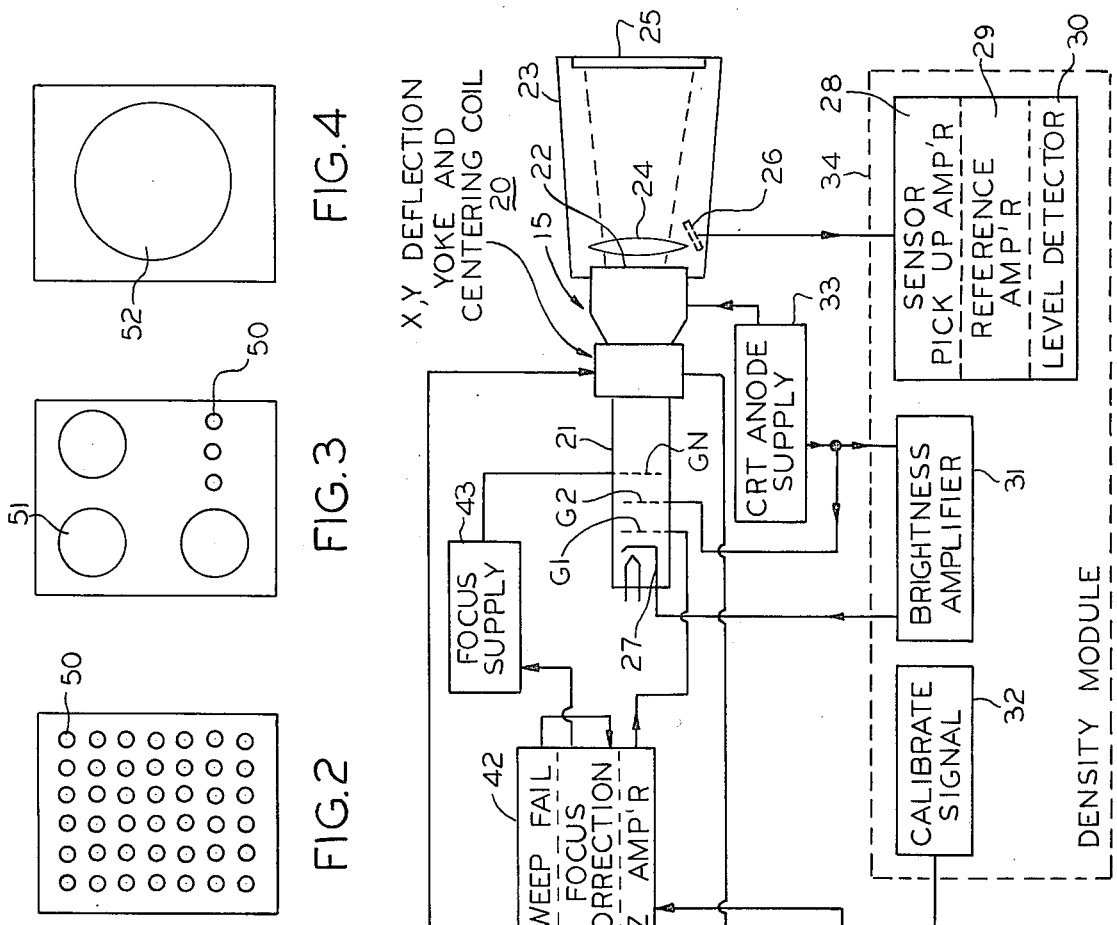
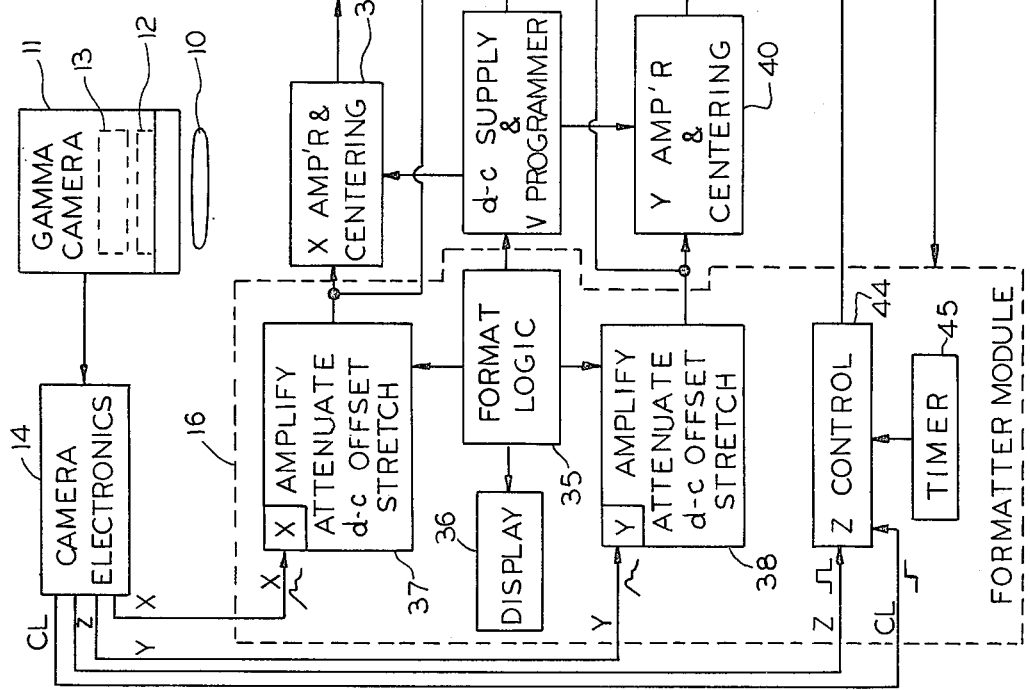

APPARATUS FOR CONTROLLING AND DISPLAYING SCINTILLATION CAMERA INFORMATION

BACKGROUND OF THE INVENTION

This invention pertains generally to the field of nuclear medicine and particularly to improvements in apparatus for displaying images resulting from detecting radiations emitted by the body or an organ which has been infused with a radioisotope.

The improvements herein described may be used in conjunction with any of several known types of scintillation cameras which are more commonly called gamma cameras since they usually sense gamma radiation. A format display which will be described is useable with a variety of image acquisition and display systems.

A well known gamma camera is described in U.S. Pat. No. 3,011,057 to Anger. This camera has a large scintillation crystal disk which is disposed over the radioisotope infused organ and responds to absorption of gamma ray photons emitted from the organ by producing visible light scintillations. A closely packed array of phototubes is located behind the scintillator and their output signals, corresponding with scintillation events, are processed to determine the $x$ and $y$ coordinates of the scintillations and the energies of the gamma photons. The electric pulses which result from scintillations are fed to a pulse height analyzer. Pulses falling outside of a narrow energy range, called a window, are rejected and pulses within the window are considered valid and by suitable known electronic means, they produce a $z$ signal coincident with the $x$ and $y$ coordinate signals.

The $x$ and $y$ coordinate signals are used to drive the beam deflection control circuits of a cathode ray tube on which the cumulative image of a large number of scintillation events is displayed. The cathode ray tube is unblanked only by the $z$ signals so that only valid scintillations are displayed. Typical methods of developing suitable $x$, $y$ and $z$ signals are described in U.S. Pat. Nos. 3,697,753 and 3,919,556.

Images displayed on the cathode ray tube (CRT) screen are usually recorded with a photographic camera. There are known systems for displaying the images in different formats on the CRT screen and for recording the images correspondingly on photographic film. For instance, the CRT may be controlled so that the image occupies the whole area on the screen in which case the whole area of the film will be covered in one exposure. The CRT may also be controlled to display the images consecutively on smaller adjacent areas of the screen for being recorded correspondingly on the film. As many small images might be recorded as can be meaningfully recorded on the film and this depends on film size which is commonly 5 × 7 inches and 8 × 10 inches. In the apparatus to be discussed in detail hereafter, for example, as many as six columns and seven rows of small images may be produced on the screen in sequence and after each area is recorded on film the CRT deflection is indexed so that the next image will be recorded without double exposure. The exemplary system, besides permitting as many as 42 approximately 1 inch images on one 8 × 10 film, permits other combinations such as eight-on-one or four-on-one or fewer proportionately larger exposures on one film.

Insofar as is known, for high resolution systems, prior practice is to deflect the electron beam of the CRT electromagnetically and to focus the beam electromagnetically rather than to focus electrostatically. Electromagnetic focusing is used because it results in sharp focus which is important. However, electromagnetic focusing has disadvantages. It requires mounting a focusing coil on the neck of the CRT so it has all degrees of freedom for alignment and focusing purposes. That is, the coil must be able to translate in and out on the tube neck and it must be able to roll, pitch and yaw to effect proper focus and alignment. Getting focus and alignment correct at the same time requires so much skill and instrumentation that the adjustment is often made at the factory where the whole coil and its mounting is finally encapsulated in resin so it cannot be adjusted in the field. If the CRT must be replaced, the permanently bonded focusing coil and deflection yoke must be thrown away too. Hence replacement is more costly.

If the deflection signal amplifiers do not have a high power rating the anode voltage on the CRT may be reduced to obtain the necessary deflection sensitivity. But the reduction in anode voltage is at the expense of losing some of the sharpness of magnetic focus so benefits of magnetic focusing are negated to some extent. If the electromagnetic deflection amplifier output current is low, the deflection speed is low. This has been compensated heretofore by slowing the gamma camera down or, in effect, stretching the camera pulses to get a longer flat line on the waveform to allow time for generating the z pulse. This, however, is at the expense of missing some of the scintillations and extends the time required for an exposure.

Another problem in prior art formatted gamma camera displays is to maintain the CRT beam focus even for images formed with the beam deflected far from the center of the CRT screen. Dynamic focus correction is, of course, known in the oscilloscope and television arts but dynamic correction circuits are costly since they require power supplies and components which must be as fast as the deflection amplifiers.

Another deficiency in prior art formatted gamma camera systems is the lack of a good mode for indicating to the operator in an unambiguous way which areas on the CRT screen and the film are available for use, which have been exposed and which formats are still available for image exposures of various sizes so as to be certain that double and overlapping exposures will be avoided and that available areas will not be wasted.

Still another problem in prior art gamma camera imaging systems is that of using the same high deflection coil voltage and power for the small beam deflections required for multiple small format images as is used for a single image that fills the entire face of the CRT.

Yet another problem is in the schemes which have been used heretofore for setting the voltages that govern the intensity of the CRT beam and, hence, the film density during a diagnostic study and for calibrating the intensity voltages between studies to compensate for loss of brightness resulting from aging of the phosphor screen in the CRT. Known prior practice is to use a light sensor which views an area of the tube screen that is dedicated to developing a test signal indicative of phosphor brightness in that area but not in the areas where images are normally formed so it is possible that the test will not simulate true operating conditions.

SUMMARY OF THE INVENTION

A general object of the present invention is to overcome the above noted problems in prior art gamma camera image display systems.

One of the more specific objects is to provide a system which allows electrostatic focusing of the CRT to be used in combination with magnetic deflection coils driven by a high speed amplifier and to obtain satisfactory focusing and ease of alignment without the nuisance of magnetic focusing coil manipulation.

A further object is to provide means for correcting the beam defocusing that normally occurs when the electron beam is deflected from the center of a CRT by correcting primarily for the center point of any image away from the center of the screen which correcting means is not only applicable to electrostatic focusing herein proposed but to electromagnetic focusing as well. A corrollary to this object is to permit use of a slow and, therefore, low cost power supply for supplying the focus correction current since correction is only made for the center point and any focus error between the center and edge of any but a full format image will be inconsequential.

Yet another object is to program the voltages supplied to the deflection current amplifiers in correspondence with the size of the images in the format so that no more power will be used for deflection than is necessary to obtain adequate speed for a given format size and so that there will be less stress on the electric components, thereby improving reliability.

An important object is to provide a device which displays one kind of signal for indicating when an area of the CRT screen is ready for an exposure, another kind of signal during the time that an exposure of the selected area is in progress and still another kind of signal indicative of the area having been exposed and being no longer available in the particular sequence. An important aspect of this system is to permit the operator to make a quick scan of the incremental image areas in the format scheme to determine at any time which areas are available for exposure.

How the foregoing and other specific objects of the invention are achieved will appear in the following description of an illustrative embodiment of the invention which will now be set forth in reference to the drawings.

DESCRIPTION OF THE DRAWINGS

FIG. 1 is a block diagram of pertinent components of the system;

FIGS. 2-4 show some of the image formats obtainable;

DESCRIPTION OF A PREFERRED EMBODIMENT

Figure 5:
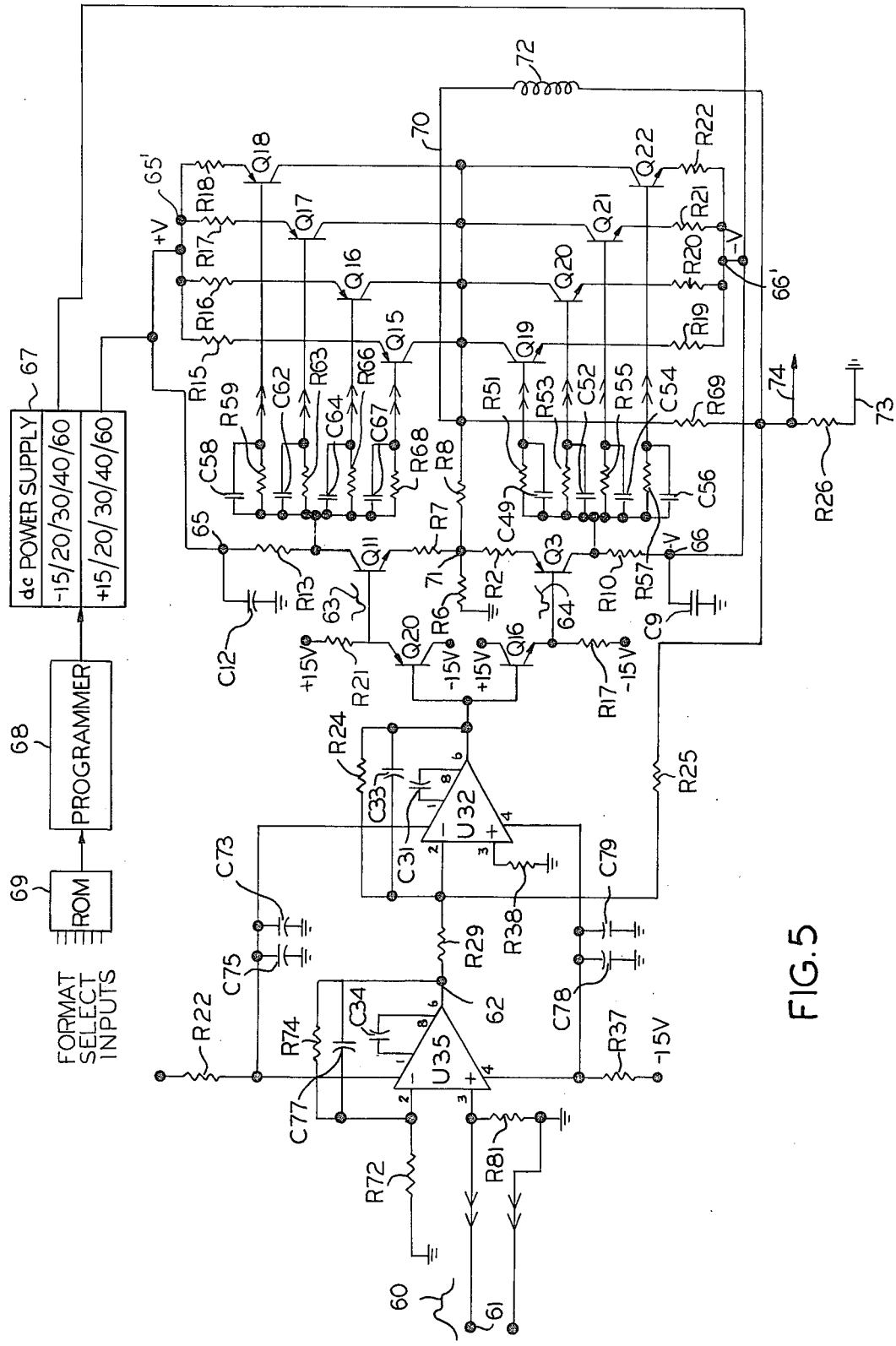
FIG. 5 is a diagram of a high slew rate deflection amplifier system in accordance with the invention.

FIG. 1 is a block diagram for outlining the general features of a gamma camera and its associated display system.

A body in which a radioisotope could be administered is marked 10. A conventional gamma camera 11, such as an Anger camera, is disposed over the body. The gamma camera has a crystalline disk 12 which produces scintillations in response to absorption of photons radiated from the isotope. An array of detectors 13, usually photomultiplier tubes, intercepts the scintillations and produces output signals which are fed to the camera electronics module 14. This module computes the $x$ and $y$ coordinates of the scintillations. Signals representative of the scintillations energies are supplied to a pulse height selector, in the camera electronics, not shown, and signals falling with the window of the selector are caused to produce $z$ signals. The $z$ signals are effective to unblank cathode ray tube (CRT) 15 in correspondence with the electron beam of the tube being deflected to the point defined by the $x$ and $y$ coordinate signals which are processed in the camera electronics and elsewhere and are delivered to the deflection coils of the CRT 15.

As shown in FIG. 1, the $x$, $y$ and $z$ signals are supplied from the camera electronics module 14 to a formatter module 16 where they are utilized as will be described. There is also a control signal line CL between the camera electronics 14 and formatter module 16. The control line CL is used to pass signals between the camera electronics 14 and module 16 and the signals are conveniently used as timing signals for turning the formatter on and off as required in the improved system herein described. The approximate shape of the $x$, $y$ and $z$ signal waveforms are shown adjacent the corresponding inputs to the formatter module 16.

CRT 15 has $x$ and $y$ deflection coils and a conventional beam centering coil which are symbolized by the block 20 on the neck 21 of the tube. As is customary, there are a pair of magnet coils for deflecting the cathode ray beam in the $x$ or horizontal direction and another pair for deflecting the beam in the $y$ or vertical direction on either side of the center of the tube face or screen 22. The deflection coils are current driven. The centering coil is used in the customary way which involves moving it while energized until the electron beam spot is centered on the tube screen 22. The deflection yoke and coil construction are, of course, basically conventional.

The CRT face or screen 22 is in a light tight enclosure 23 in which there is a lens system 24 which projects the gamma radiation distribution patterns or images on a photographic film in a cassette 25. The number and size of the images displayed on the CRT screen 22 are selectable under the control of format logic which is symbolized in FIG. 1 by the block 35.

In front of CRT screen 22 and in noncontacting relation therewith is a photocell sensor 26 which, in accordance with one feature of the invention, is used for maintaining exposure control. As will appear, when the system is set to a calibration mode, a calibration or test image is generated on the CRT screen 22 and closely simulates a fairly uniform dot pattern that would result from uniformly distributed emissions from an isotope infused body. The photocell 26 senses the brightness of the test image on the screen 22 and the resulting signal is processed electronically and compared with a reference so that any error signal can be used in a feedback system to adjust bias on cathode 27 relative to the grid G1 of the CRT and thereby restore brightness of the tube to the level it had when it was new. Thus, loss of brightness due to degradation of the CRT phosphor in the screen and any loss of cathode emission can be compensated easily and regularly.

The subsystems involved with controlling and sensing CRT brightness are shown in FIG. 1 as being in a so called density module defined by the dashed line block 34. The main components are the sensor pick-up amplifier 28, reference amplifier 29, level detector 30, brightness amplifier 31 and calibrate signal generator 32. The CRT anode supply block is marked 33.

In FIG. 1 the new format display is symbolized by the block marked 36. The display permits the operator to determine what areas of the screen and, hence, the photographic film has been used or exposed and it reveals the areas and possible formats which are obtainable. The operator makes the determination by observing lights on a display panel. The display also reveals the status when the system in set to index images automatically. The display, which will be described in detail later, is distinguished by providing a first kind of signal, namely, a dark signal for each area which is not yet exposed nor designated for exposure, a second kind of visual signal for indicating the area on the screen on which the next image will appear when the readout is activated, a third kind of signal for indicating that exposure is in progress and a fourth kind of a signal for indicating which areas have been used.

The pulse signals from the gamma camera which represent the $x$ and $y$ coordinates of a valid scintillation are processed in blocks 37 and 38, respectively, under control of the format logic block. As indicated on $x$ block 37, for example, the circuitry in this block stretches the pulses if required, amplifiers or attenuates the pulses, and adds a d-c offset voltage and stretches them as required. The processed signals are then used to drive a fast amplifier 39, (shown in detail in FIG. 5), whose output serves as a current source for the $x$ deflection coils in yoke 20 of the CRT.

The d-c offset voltage is regularly used in formatters and is dictated by the format logic 35 which is subject to manual selection. The d-c offset is for establishing the beam of the CRT in the geometric center of whatever image size or format has been selected and the amount of amplication or attenuation determines the distance in the $-x$ and $+x$ directions through which the CRT beam will be deflected to create an image of the desired width on the screen for the format that has been chosen.

Block 38 which processes the $y$ coordinates of the scintillations performs similarly to block 37 and need not be further described. The output signals from block 38 drive a fast $y$ deflection amplifier symbolized by a block 40 which supplies deflection current to $y$ deflection coils in yoke 20.

A unique feature of the system is that the supply voltages for the $x$ and $y$ deflection amplifiers 39 and 40 are programmed or varied in accordance with the selected size of the images in the format on the CRT screen. This function is symbolized by the block 41. The format logic 35 causes block 41 to select the proper supply voltage for the fast $x$ and $y$ amplifiers 39 and 40 which are used in the system. Using different deflection amplifier supply voltages for different size formats minimizes the problem of dissipating heat from the electronic components.

Another subsystem in FIG. 1 is symbolized by the block 42 and includes a deflection or sweep fail protective circuit, focus correction circuit and the $z$ signal video amplifier circuitry. The sweep fail circuit blocks the $z$ amplifier output if $x$ and $y$ deflection fails. If the CRT beam is undeflected from one spot for a very short time it would burn an artifact or hole in the phosphor. The focus correction achieved with block 42 is an area or quasi focus scheme as opposed to full dynamic focus correction. Only the center of each image is corrected when the beam is deflected away from the center of the CRT screen since focus will not vary significantly over the area of the image. The focus correction signals from block 42 control the focus supply in block 43 and ultimately the focus voltage which is applied to the electrostatic focusing gun electrode GN in the CRT. The $z$ amplifier in block 42 supplies the voltage to control grid G1 of the CRT and turns the tube on and off in synchronism with occurrence of valid scintillations. An alternative is to apply the $z$ signals to the cathode of the CRT to cut off the beam and to use this grid to control brightness of the tube.

The formatter module 16 in FIG. 1 contains the $z$ signal control represented by block 44. It is associated with a timer 45. These two systems cause exposure or images to be terminated on the basis of a chosen time interval having expired or on the basis of a predetermined number of scintillations having been counted.

FIGS. 2, 3 and 4 depict some of the image formats obtainable with the system as they might appear on the photographic film. The format in FIG. 2 consists of 42 of the smallest images 50 in six columns and seven rows. One image at a time is, of course, presented on the CRT screen 22 and they are recorded on the film consecutively or in whatever order they are presented. The formats may be comprised of large and small images as in FIG. 3 where there are three large images 51 and three small images 50. The FIG. 4 image 52 occupies the whole CRT screen and, hence, the film. Image size and numbers are selectable, which is a procedure that is known per se in the art.

Circuitry for accomplishing some of the functions heretofore outlined will now be described. An important component in the system is a high speed amplifier which is used for driving current through the $x$ and $y$ magnetic deflection coils comprising deflection yoke 20. The $x$ deflection and $y$ deflection amplifiers used are identical. The amplifier circuit is shown in FIG. 5. As mentiond earlier, scintillations occur at high rates, and count rates of 200,000 per second can be handled by the present system. The amplifiers must be able to create the deflecting field very rapidly for having the beam in the correct coordinate position when the $z$ signal unblanks the CRT to write a point of light on the CRT screen. The gamma camera output in some prior systems must be slowed because the deflection amplifiers are not fast enough.

If the amplifier system in FIG. 5 is for the $x$ deflection signals, for instance, $x$ coordinate pulses such as 60 will be fed into its input terminal 61. These pulses will have their amplitude or gain controlled in accordance with the size of the image that is displayed and a d-c offset voltage which will previously have been inserted in a manner which will be described later. The offset voltage centers the CRT beam in whatever image is on the screen. The z pulses unblank the CRT when the beam reaches the point defined by the existing x and y coordinate pulses. The x or horizontal deflection coil is at the right of FIG. 5. The y coil is essentially the same and is driven by a similar amplifier. The amplifier in FIG. 5 has a voltage input signal and a current output signal and is distinguished by its high slew rate.

A high "slew rate" amplifier is one whose output signal changes at a rate which corresponds closely with the rate of a rapidly changing input signal, such as a step voltage signal, when the amplifier is operating in its linear range. In respect to the amplifier system in FIG. 5, high slew rate means that the current delivered over output line 70 to one of the deflection coils 72 will reach maximum substantially coincident with the input x or y coordinate signal 60 reaching a stable level. Hence, the input coordinate signals need not be previously stretched excessively to allow the amplified deflection signal to build up for deflecting the cathode ray tube beam to the proper point before the beam can be unblanked with the z signal. This permits processing scintillations at a higher rate.

The first stage of the FIG. 5 amplifier system comprises an operational amplifier U35 which in a commercial embodiment is a bipolar type CA 3100S for matching a high input impedance with a low output impedance. U35 has a fast slew rate. The input signals 60 are supplied to noninverting input pin 3. R81 acts as a cable terminator. U35 has a feedback circuit comprised of a resistor R74 in parallel with a capacitor C77 and an input resistor R72 in series with it with the midpoint connected to the inverting input pin 2. A compensating capacitor C34 is connected between pins 1 and 18 of U35. The positive and negative power supply terminals have resistors R22 and R37 and capacitors C75, C78, C73 and C79 for power supply decoupling.

The output signal from pin 6 of U35 is shown at 62. This signal is coupled through a resistor R29 to the inverting input terminal pin 2 of another CA3100S operational amplifier U32 which inverts and effects gain. There is a feedback circuit, connected between output pin 6 and inverting input pin 2, comprised of R24 and R25 and a capacitor C33 so the gain of U32 is between five and six in this example. The noninverting input terminal pin 3 is connected to ground through a resistor R38. A compensating capacitor C31 is connected between pins 1 and 8 of U32.

The single ended output from pin 6 of U32 is fed to emitter follower buffer stages comprising a PNP transistor Q20, which is a type 2N3906, in this example, and an NPN type 2N3904 transistor Q16 or their equivalents. Q20 conducts when its base is negative relative to its emitter and Q16 conducts when its base is positive. These transistors are connected to the power supply terminals as shown and they have emitter follower resistors R17 and R21. The slit output signals from the emitters are marked 63 and 64.

The output signals 63 and 64 are supplied to the bases of any NPN type PG1101 transistor Q11 and a PNP type PG2101 transistor Q3 comprising another amplifying stage. The collector of Q11 is connected to the positive supply voltage terminal 65 through collector resistor R13 and the collector of Q3 is connected to the negative supply voltage terminal 66 through a collector resistor R10. The supply voltage terminals have filter capacitors C12 and C9 connected between them and ground. The supply voltages at 65 and 66 come from a dual d-c programmable power supply which is shown in block form and marked 67. The power supply 67 can provide various output voltages selectively, depending on the size of the images on the format, in accordance with one feature of the invention. The output voltage from supply 67 is selected with a programmer 68.

The next stages are a class B amplifier when considered together comprised of groups of complementary pairs of PNP transistors Q15 to Q18 which are type 2N6231 and NPN transistors Q19 to Q22 which are type 2N5634 in a commercial embodiment. All of the PNP transistors are in parallel as are the paired NPN transistors and their collectors are all connected to a common output or load supply line 70. One suitably large transistor could supplant the four in each group but four are used to ease the problem of heat dissipation by spreading it among four transistor junctions instead of one. Most of the power supplied by the transistors is dissipated in them as heat. Little of the power is consumed in the load circuit which in this case is the deflection coil. Transistors Q15-18 have stabilizing resistors R15-18 connected between their emitters and positive supply 65' and transistors Q19-22 have similar resistors R19-22 connected to negative supply 66' to prevent current hogging by any one of the transistors. The driving signals from the collector of predriver Q11 are fed to the respective bases of PNP transistors Q15-18 through resistors R59, R63, R66 and R68. These resistors are in parallel with speed up capacitors C58, C62, C64 and C67. The signals from predriver Q3 are fed to the respective bases of transistors Q19-22 through resistors R51, R53, R55 and R57 which have capacitors C49, C52, C54 and C56 in parallel. The emitters of Q3 and Q11 are connected through resistors R2 and R7 to point 71 between resistors R8 and R6 which determine loop gain of the last two stages.

The current output line 70 leads to a deflection coil such as 72 in the yoke 20 of the CRT and the other end of the deflection coil connects to ground 73 through a sampling resistor R26. The top of R26, which is essentially at ground potential is connected by way of line 75 and a resistor R25 to the inverting terminal of operation amplifier U32 to induce fast settling of U32. The sample voltage obtained across R26 between its ends 74 and 73 is used in a circuit that prevents the z signals from unblanking the CRT in the event either horizontal or vertical deflection or sweep fails so the CRT phosphor will not be burned. The sweep fail protection circuit will be described in detail later.

In a commercial embodiment the amplifier output current to deflection coils 72 slews at somewhere between 5 and 10 amperes per microsecond. Even with scintillation counts which occur 4 or 5 microseconds apart the amplifier of FIG. 5 is able to force the beam to the x and y coordinates of the pulse or scintillation.

The amplifier system in FIG. 5 can drive maximum current through the deflection coils at the instant that the input coordinate signal 60 of any magnitude occurs or, in other words, the output voltage of the amplifier slews in good conformity with the input signal rise mainly because of the high gain in the output stage comprised of transistors Q15-Q18 and Q19-Q22. These transistors are connected in the common emitter configuration, accounting for their high amplification and gain. The collectors of the transistors are connected together so their impedance is low and total current can be high. Thus, they can drive a deflection coil 72 which has low inductance so as to permit a high rate of change in current and magnetic deflection field strength.

An important feature of the system is the programming of different voltages for different formats to the supply terminals 65, 65' and 66, 66' of the deflection amplifiers which voltages are selectable in increments exemplified on the d-c power supply block 67. The power supply must be a stiff one having good regulation. The d-c power supply 67 used in a commercial embodiment is essentially the same as one depicted and described at page 286 of the General Electric Company SCR Manual, 4th Edition, 1967. A ROM 69 has a plurality of inputs for binary signals which encode the selected image format. The ROM converts the format selected to an output useable by programmer 68 and the programmer selects the voltage which results in the power supply 67 providing the desired output voltage to the deflection amplifiers.

Figure 6:
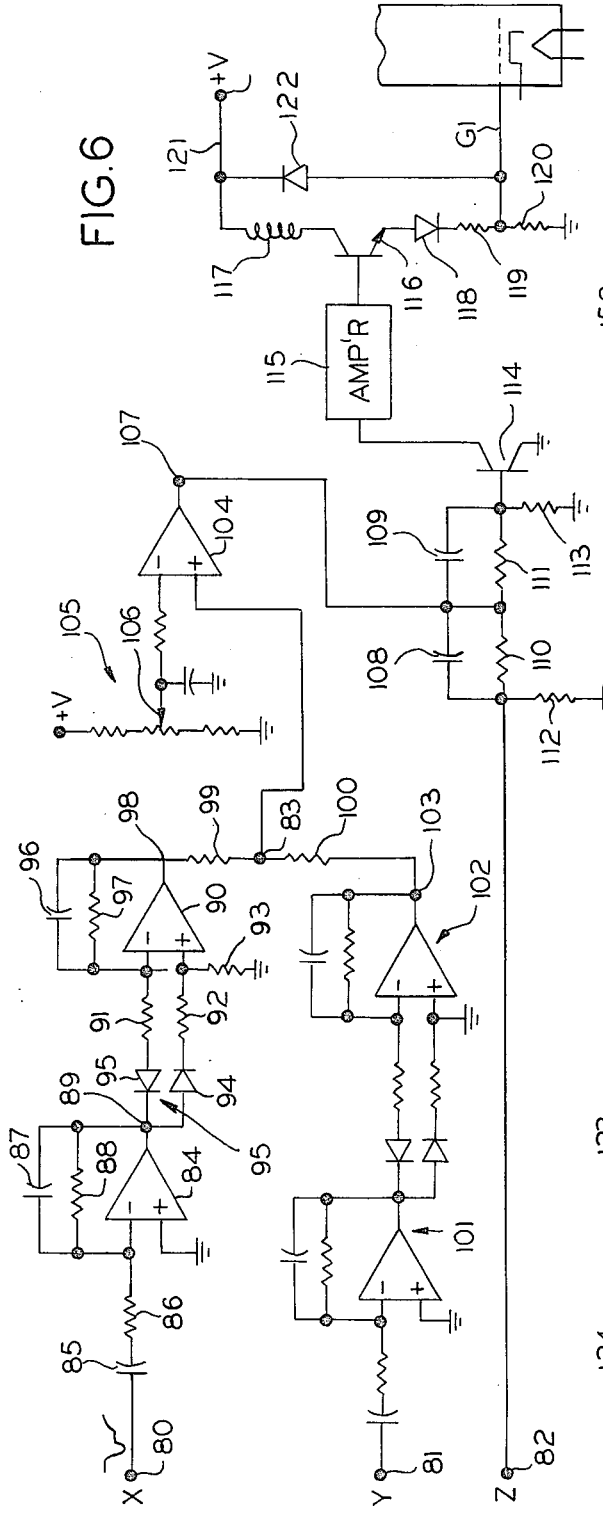
FIG. 6 is a diagram of a circuit for protecting the CRT against deflection failure.

FIG. 6 is a simplified schematic of a circuit which is for preventing the phosphor screen of the CRT from being damaged if either the $x$ or $y$ deflection amplifiers fail. The sharply focused beam would burn the phosphor and create a dead spot if a high current beam stayed in one spot for a few microseconds for instance. The circuit in FIG. 6 is called a sweep fail circuit earlier in block 42 of FIG. 1.

In FIG. 6, $x$ and $y$ deflection voltage samples from across R25 in FIG. 5 are supplied to input terminals 80 and 81. The circuits following the input terminals are identical up to a summing point marked 83 so only the upper part will be described. It comprises an operational amplifier connected as a conventional differentiator 84. The $x$ sample signal is a-c coupled to the inverting input of the differentiator through a differentiating capacitor 85 and a stabilizing resistor 86. The differentiating resistor 88 and a small parallel roll off capacitor are connected from input to output of 84. The differentiator removes the d-c component of the input signal. The gain is a function of frequency. The higher the input frequency the higher the gain.

The differentiated output signal at 89 is supplied to an absolute value circuit comprising an operational amplifier 90, diodes 94, 95, resistor 91, a small stabilizing capacitor 96 in parallel with resistor 97, a divider consisting of resistors 92 and 93 and the amplifier output terminal 98. This circuit makes all output signals positive regardless of the polarity at the input.

The $y$ sample circuit is similar and also comprises a differentiator 101, an absolute value circuit 102 and an output terminal 103 on which a positive voltage is present if there is $y$ deflection signal on the input 81. In FIG. 6, it is easy to see the correspondence of the $x$ and $y$ differentiator circuits so the latter need not be discussed.

Junction point 83 intermediate output resistors 99 and 100 of the two absolute value circuits is a summing point which is connected to the noninverting input of an operational amplifier 104 connected as a comparator. The reference voltage for the comparator, which is supplied to the inverting terminal is developed with a voltage divider and potentiometer generally marked 105. In normal operation, that is, with $x$ and $y$ deflection current present, the voltage at summing point 83 is greater than the voltage on arm 106 of the potentiometer. The output terminal 107 of the comparator 105 is normally high. If either $x$ or $y$ deflection signals fail, the voltage developed at summing point 83 falls below the reference voltage which causes the comparator to switch its output terminal 107 low. This will prevent the $z$ signals from unblanking the CRT.

Normally the $z$ input signals at input terminal 82 flow through a network comprised of speed up capacitors 108 and 109 and resistors 110–113 and actuate a switching transistor 114. They are further amplified in an amplifier 115 which controls an output transistor 116. Transistor 116 has an inductance 117 in its collector circuit and a diode 118 and resistors 119 and 120 in its emitter circuit. When a $z$ pulse occurs under normal conditions, that is, with both $x$ and $y$ deflection coils operative, transistor 116 conducts and causes nearly the full positive supply voltage at supply terminal 121 to be applied to grid G1 of the CRT, thus unblanking it. In a commercial embodiment the supply voltage is 60 volts and a square wave pulse of about 55 volts is applied to G1.

When the comparator 105 trips on deflection failure and its output 107 goes low, transistor 114 is without driving voltage and it stays off. Hence G1 cannot go positive to unblank the CRT.

The image area focus correction circuit of FIG. 7 will now be described. As mentioned earlier, the CRT used in the new system uses electromagnetic deflection in combination with electrostatic focusing and avoids the handicaps of magnetic focusing systems which have been used in some gamma camera display systems. Either type of focusing adjustment involves obtaining the sharpest focusing possible with the electron beam of the CRT in the center of the screen. However, when the beam is deflected to write an image away from the center of the screen some defocusing occurs and the amount depends on the distance from the center. The focus variation or error should be corrected for the sake of getting the best image resolution. Defocusing is primarily a geometric consideration. There are prior art methods available for correcting focus dynamically, that is, by making a continuously variable change in the voltage or current that is applied to a magnetic focusing coil in proportion to the distance of the beam from the center of the screen. This requires high grade fast stable and expensive multipliers, dividers and d-c power amplifiers to be used for driving the focusing coil and it entails the handicaps of having to use magnetic focusing coils.

In accordance with the invention electrostatic focusing is used and means are provided for correcting focus on the area basis rather than dynamically over the full sweep of the CRT beam. Area focus correction involves correcting focus in the center of the image only and tolerating the imperceptible focus error that may occur between the center and edge of the image. In other words, focus is corrected for that point in the center of the image where the offset voltage signal that is added to the deflection currents established the beam to write any selected format. The focusing voltage applied to focusing gun electrode GN with the beam centered in the CRT is usually around 3000 to 5000 volts. It has been found that, generally, any focusing error in the electrostatic system can be corrected with under 100 volts change in the focus voltage at center. The anode voltage on the CRT can be upwards to 25 Kv, which is beneficial in that a high anode voltage in itself sharpens the beam focus. In comparing results obtained with the electrostatically focused tube of the present invention, that was corrected as herein described and which used an anode voltage of about 15000 volts it was found that focusing was as good or better than was obtainable with a prior art magnetic focusing system that had to be operated with an anode voltage of about 10,000 volts, thereby suffering loss of focus, where the lower voltage had to be used because the deflection amplifiers were not fast enough. As explained earlier, this meant that the gamma camera output had to be slowed down and image recording time was undesirably extended.

Figure 7:
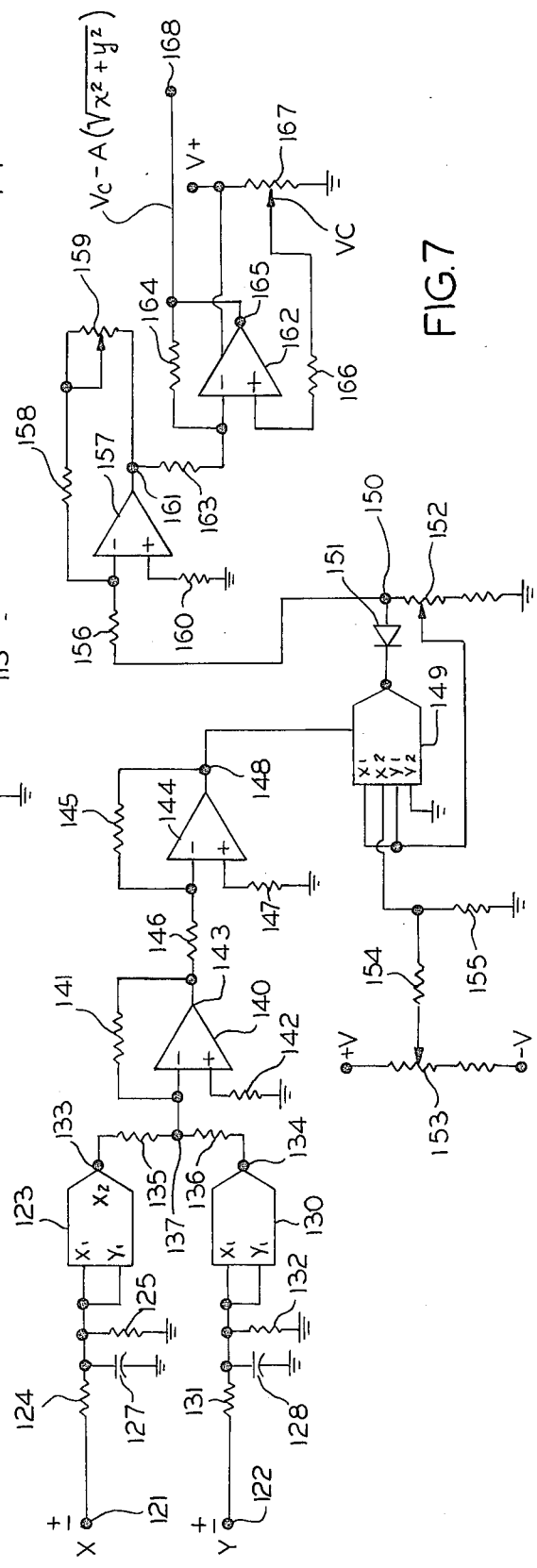
FIG. 7 is a diagram of a circuit for correcting the focus of the CRT.

In the FIG. 7 focus correction circuit, signals are developed which are a function of the polar coordinates of the beam at the image centers. In other words, the correction is a function of the hypotenuse or radial distance of the image centers from the CRT screen center. In FIG. 7 the same $\pm x$ and $\pm y$ coordinate signals including their d-c offset components that are supplied to the input of the amplifier system in FIG. 5 are supplied to input terminals 121 and 122, respectively, of the focus correction circuit. The $x$ coordinate signals, for instance, are supplied to the inputs of a multiplier 123 which has an input filter in its input circuit comprised of resistors 124 and 125 and capacitor 127. The filter filters out all high frequencies and accepts only very low frequencies which is the offset component. Multiplier 123 is preferably a four-quadrant multiplier. In a practical case, a type 532/4205 was used but other suitable types are available and may be used as is known to those versed in the art. The $y$ coordinate signals are supplied to a similar multiplier 130 which has a filter comprised of resistors 131 and 132 and capacitor 128.

Generation of the function $\sqrt{x^2 + y^2}$ is the objective. Multiplier 123 multiplies each $x$ signal magnitude by itself, that is, it squares the $x$ coordinate signals. Multiplier 130 similarly squares the $y$ coordinate signals. As is typical of commercially available multipliers, the signals from output terminals 133 and 134 are at a level of $x^2/10$ and $y^2/10$, respectively. These output signals past through dropping resistors to a summing junction 137 on which a current signal of $(x^2 + y^2)/10$ occurs. The summed signal is fed to the inverting input of an operational amplifier 140 which can be a type $\mu$A741C. It has a feedback resistor 141 between its input and output equal in value in this example to the values of resistors 135 and 136 so the amplifier produces a gain of about one and inverts. The signal level at the output 143 of amplifier 140 is substantially the same as at its input and is $-(x^2 + y^2)/10$.

The output signal from amplifier 140 is fed to the inverting input of another similar operational amplifier 144 which has a feedback resistor 145 between its output and input and an input resistor 146 which together cause amplifier 144 to have a gain of about one in this example. A resistor 147 connects between the noninverting input and ground. Amplifier 144 inverts so that the signal at its output terminal 148 is positive and has the magnitude of its input $(x^2 + y^2)/10$ and is in condition for taking its square root.

The output from terminal 148 is fed to the input terminal of a multiplier 149, which may be similar to the others, and which is connected to take the square root of the input signal. The square root calculator 149 performs the functions of multiplying the input signal by 10 and then taking the square root of $x^2 + y^2$ which appears on its output terminal 150. The output signal has a negative sign as shown on the drawing. A diode 151, which prevents lockup, polarized as shown, is connected to output 150. A potentiometer 152 is used for obtaining a scale factor adjustment. Another potentiometer 153, connected to a divider comprised of resistors 154 and 155, is used to set the zero offset of the square root calculator 149.

The output at point 156 is proportional in magnitude to the polar vector or hypotenuse from the center of the CRT to the center of the substantially circular image of whatever size and number is commanded by the format logic 35.

The negative going output voltage from terminal 150 is coupled through an input resistor 156 to the inverting terminal of an operational amplifier 157 which has controllable gain. There is a temperature compensating resistor 160 connected between the noninverting terminal of the amplifier and ground. The amplifier also has a feedback circuit, comprised of a fixed resistor 158 and a variable resistor 159, connected between its output terminal 161 and its noninverting input. Resistor 159 is adjustable and is used to set the focus of the beam at the edge of a test image on the CRT screen.

Another stage is provided for adjusting and controlling the electrostatic focusing voltage at the center of the CRT screen. It comprises an operational amplifier 162. The amplifier has an input resistor 163 connected to its inverting input terminal and a feedback resistor 164 connected to said input terminal and its output terminal 165. The inverting terminal is supplied with the output signal from amplifier terminal 161 which is the voltage that sets focus at the edge of an image. Amplifier 162 also has a loop connected at one end to its noninverting input terminal and including a resistor 166 and a potentiometer 167. Potentiometer 167 is adjustable to provide a control voltage to amplifier 162 which sets the beam focus at the center of the CRT screen. Amplifier 162, therefore, sums the center focus and edge focus control voltages. The sum of the voltages appears on output line terminal 168 and is of the form indicated on the drawing.

The voltage signal from output terminal 168 controls the input of a d-c power supply, not shown, which, in turn supplies controlled high voltage to the focusing electrode GN of the electron gun in the CRT.

The CRT focusing procedure involves adjusting center focus potentiometer 167 until the sharpest focus is obtained with the beam in the center of the screen. Then a small image is formatted in a corner of the CRT and the other variable resistor 519 is adjusted until the sharpest focus is obtained with the correction inserted. The procedure may be repeated for optimization since there may be some interaction between the focusing controls. Finally, focus should be tested in four corners of the screen with the focusing controls being trimmed as required.

With the above described system, focus voltage is corrected for the center of the image but any error at the edge of the image is not noticeable by the human eye. Consider for instance, a case where the voltage required to get sharpest focus at the center of the screen is around 4000 volts applied to the focusing gun electrode GN. If the beam is deflected to near the edge of the screen for a small image format, perhaps a 100 volt or less correction voltage might be applied. This is only about 2.5% of the center voltage. The correction from the center of an image away from the center of the tube to the edge of the image is an even smaller percentage, perhaps a half percent. This brings out an advantage of the invention in that a focusing power supply may be used which responds quite slowly to demands for voltage changes since it only needs to correct for small movements of the beam. This can be an inexpensive commercially available supply instead of one that is specially designed such as is the case with dynamic magnetic focusing where almost as much power must be provided with the focus correction amplifier as is provided for the beam deflection amplifier.

The area focus control just described in connection with electrostatic focusing is not intended to be limited thereto. Those skilled in the art will appreciate that focus control circuits comparable to those described may be used with a voltage/current amplifier in a magnetic focusing system as well.

Figure 8:
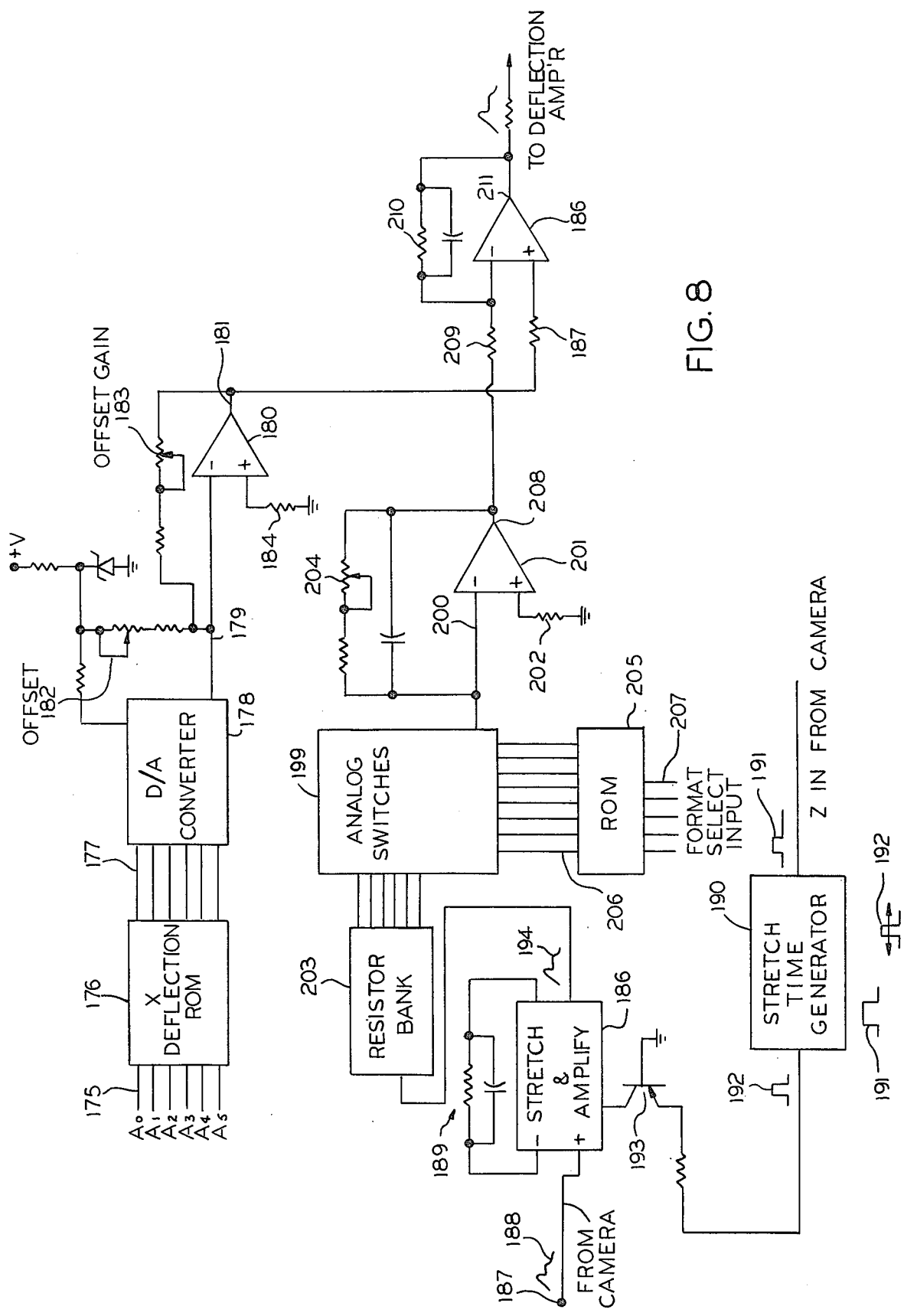
FIG. 8 is a diagram of a circuit for developing deflection voltage and offset voltage signals for driving the deflection amplifiers.

Refer now to FIG. 8 which shows the output portion of a circuit for establishing the center point or offset of any image which is formatted and also for establishing the amounts of vertical and horizontal deflection and, hence, the diameter of the image.

The format logic, the details of which are not shown, produces digital signals representative of the address of the x and y coordinates of the center point of the image. For example, the center of the number one image in a four image format might be the one selected. This can be done for both the x and y coordinates. How one of the coordinates is handled is shown in FIG. 8. There is duplicate circuitry, not shown, for the other coordinate.

The digital address lines $A_0$ to $A_4$ are the image format inputs to a read only memory (ROM) such as a 32 × 8 bit type IM5600CDE 176. The output lines 177 are a digital number which represents the center coordinate of the image. The digital signal is converted to an analog current in a digital-to-analog converter 178 which may be a type MC1408L-8. The output analog current is fed to the inverting terminal of an operational amplifier 180 which may be a type $\mu$A741C. It converts the current to a voltage and the offset voltage for the coordinate appears on its output terminals 181. The offset may be set with a variable resistor 182 in its input resistance circuit. The gain of the amplifier may be controlled with a variable resistor 183 in its feedback circuit. The offset voltage for a coordinate is fed from terminal 181 to the noninverting input terminal of an operational amplifier 186 through an input temperature compensating resistor 187. Amplifier 186 combines the offset or center point voltage signal with a voltage corresponding with a signal representing the amount of beam sweep or deflection which is required for the image which is selected by the format logic.

The attenuation or amplification, as the case may be, for the signals which set the amount of deflection in the plus and minus directions from image center begins with an amplifier and stretcher 186 to which the coordinate signals for one axis are delivered from the gamma camera. The input is marked 187. A typical coordinate pulse is marked 188. The amplifier has a feedback circuit 189. Amplifier 186 enables stretching the coordinate signal without slowing down the camera output for very large or overframed images. Stretching, which is used in the prior art, is controllable with a stretch time generator 190. It receives z signals 191 from the camera. It produces output pulses 192 which are selectively shiftable relative to input pulses 191. The output pulses 192 switch a transistor 193 which conducts to initiate the stretch interval. The output signal 194 goes to a resistor bank 203. Resistors in the bank are selectively connected in circuit with analog switches symbolized by the block 199 which may be a type 5010 analog switch. The output signals from analog switch 199 on line 200 are fed to the inverting terminal of an operational amplifier 201 which has a temperature compensating resistor 202 connected between its noninverting terminal and ground. The analog switches, when actuated switch various resistances in the resistor bank 203 into the input circuit 204 of the amplifier 201 to thereby control its gain and, hence, the amount of beam deflection for the selected image size. Which resistor is switched in from bank 203 is determined by a ROM 205 which has digital signal input lines 207 on which address signals representative of image size are received from the format logic. The ROM outputs 206 selectively control the analog switches.

The deflection gain signals, synchronized with z signals, are supplied inverted from the output 208 of amplifier 201 to the inverting input of amplifier 186 through an input resistor 209 which works with a feedback circuit 210. Thus, amplifier 186 combines the offset signals coming in on its noninverting terminal with the attenuated or amplified coordinate signals coming in on its inverting terminal. The outputs from amplifiers 186, one for x and another for y, are delivered to the inputs of the deflection amplifiers such as the one illustrated in FIG. 5.

An important feature of the system is the multiformatter display which provides visual information to the operator concerning the image areas which are available for exposure, are designated for exposure, are in the process of exposure and are already exposed. This is especially useful when a dynamic study has been made and a set of static images is desired in a different size on the same film.

Figure 9:
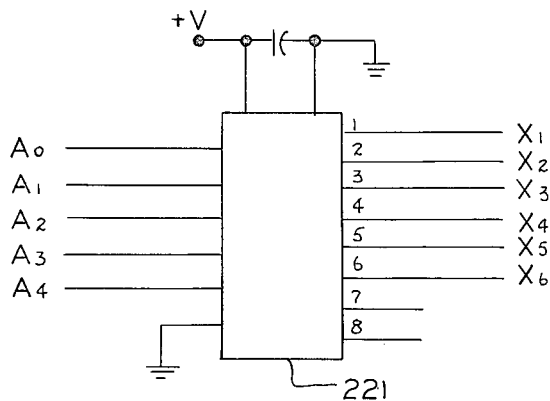
FIG. 9 shows a read only memory (ROM) for controlling a format display.
Figure 10:
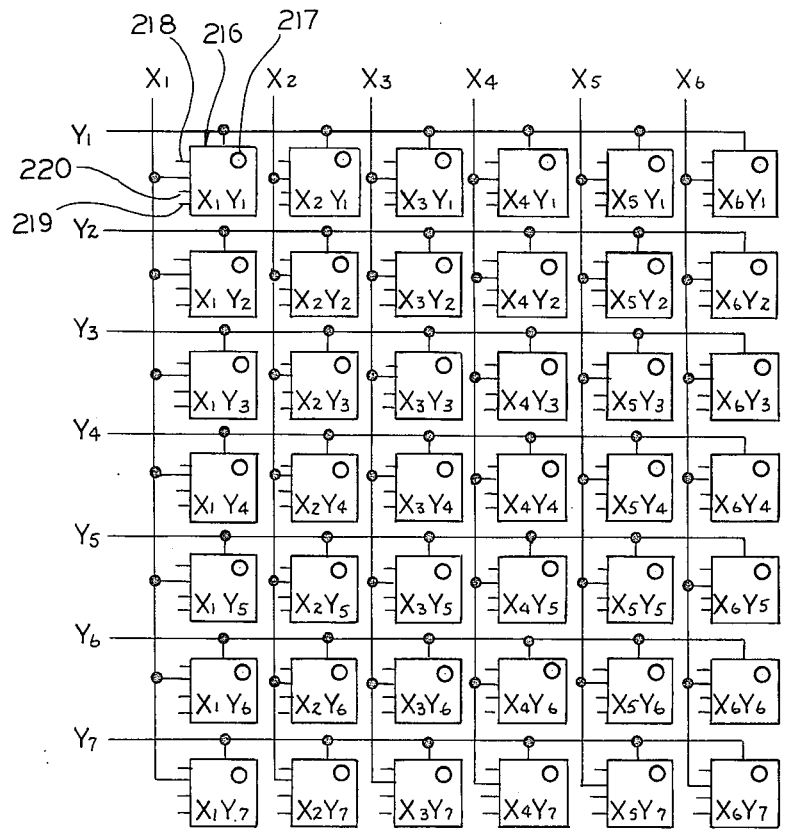
FIG. 10 shows a format display in block form.
Figure 11:
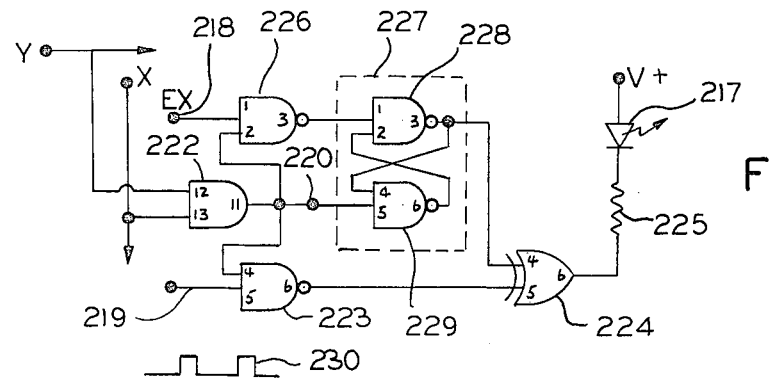
FIG. 11 shows the circuit diagram for a typical cell in the format display of the preceding figure.

Refer to FIGS. 9–11 for a description of the multiformatter display. The display in FIG. 10 has an array of identical cells such as 216 which are selectively controlled by lines $x_1 - x_6$ and $y_1 - y_7$. The cells each have an indicator light source such as 217, which in an actual embodiment is a light emitting diode (LED) but it may be a liquid crystal or incandescent lamp. Each cell has an input line such as 218 for receiving a signal which, in this case, goes high when exposure of the image area to which the cell is related is initiated. Each cell also has an input such as 219 for a pulse signal from a square wave oscillator, not shown, and each cell has a reset input signal terminal 220.

The operator observable format display panel has 42 cells, in this example, corresponding with the maximum number of the smallest images which are obtainable. More or fewer cells could be used. As will be explained, there are x and y axis ROMs, one of which is shown in FIG. 9 that determine which LEDs are lighted for each format; for example, a single picture, depending on its size can be programmed to light 1, 2, 4, 8 or other combinations of LEDs or the whole array for an image that occupies the whole CRT screen.

The signals for controlling the cells are delivered from ROMs such as the one depicted in FIG. 9 and marked 221 which may be type IM 5600 CDE. The x address ROM is chosen for illustration. The same address line $A_0 - A_4$ which control other ROMs 176 for example for determining the deflection, for example, are inputed to ROM 221. The outputs $x_1 - x_6$ lines, respectively in FIG. 10. A similar set from the other y address ROM would connect to lines $y_1 - y_7$ in FIG. 10. The x and y outputs of the ROMs are selectively high and low in accordance with the display cells that are addressed. For example, if the cell in column 6, row 1 were to be addressed, lines $x_6$ and $y_1$ would go high.

One of the identical cells is depicted in more detail in FIG. 11. Assume for the sake of illustration that cell No. 1 is addressed by $x_1$ and $y_1$ going high. This should cause LED 217 to blink or flash on and off to indicate that the camera is on that corresponding part of the film. As will appear, the LED will blink in short or long bursts to indicate respectively different formatter conditions. As an example, the LED may blink at a duty cycle of 20% on time and 80% off time when an image area is ready for an exposure and will switch to complementary blinking at 80% on time and 20% off time when an exposure is in progress and will stay on until reset when an exposure is completed covering the area which has been addressed. Initially, if an area has never been exposed the lamp will be dark.

Continuing with the illustrative example wherein only $x_1$ and $y_1$ are high in FIG. 11, the two high inputs are fed to input pins 12 and 13 of an AND gate 222, causing its output pin 11 to go high. This high signal is fed to input pin 4 of NAND gate 223 and it is enabled. The input pulses 230 from a free running oscillator, not shown, are fed to input pin 5 of NAND gate 223 which inverts so the output pin 6 of gate 223 will go high and low at the pulse rate which in this example means high 80% and low 20% of the time up to this point. The indicator will blink, respectively, at 20% "on" time and 80% "off" time. The output pulses from pin 6 of gate 223 are fed to an input pin 5 of an exclusive OR gate 224. The output pin 6 of exclusive OR gate 224 only goes low when both of its inputs are high or low. At this time input pin 4 of exclusive OR gate 224 is still low so its output pin goes low in the noninverting mode during the pulses, thereby permitting LED 217 to conduct from the positive line and resistor 225 and blink at the pulse rate and with the short "on" time. If one wants to leave the image area indicated by LED 217 without actually making an exposure, a manual control switch, not shown, is actuated and it causes the $x$ and $y$ address signals to disappear in which case the LED will simply go out.

Assume now that the control line CL has a signal on it which enables the gamma camera to start an exposure in the selected image area. A high going exposure, EX, signal is then applied to input 218 and to input pin 1 of a NAND gate 226. Since, if the output of AND gate 222 is high, its output will be high and both inputs of NAND gate 226 will be high. The output pin 3 of NAND gate 226 then will go low and this will set flip-flop 227 so its output pin 3 on NAND gate 228 will go high. Now input pin 4 of exclusive OR gate 224 will be held high but its other pin 5 will still be receiving pulses 24. In this state, operating in the inverting mode, the output pin 6 of gate 224 will go low between incoming pulses 230 so LED 217 will blink with a duty cycle of the long "on" time of 80% and the short "off" time of 20% of the total time. This is easily distinguished by the operator from the complementary blinking described earlier and the operator can tell at a glance which areas are undergoing exposure.

Once exposure is complete as governed by time or number of scintillation counts, the exposure line 218 goes low and one or more new selected $x$ or $y$ lines may go high indicating movement to another cell or cells or another area or areas. This blocks the oscillator input to the cell in question by disabling NAND gate 223 which now has a low input pin 4. Hence, its output pin 6 will go high and stay high. This means that the output pin 6 of exclusive OR gate 224 will stay low and hold the LED 217 on without blinking since the flip-flop 227 will remain set and both input pins 4 and 5 of exclusive OR gate 224 will be high. Once $x$ and $y$ go low, making the exposure line 218 high again will produce no change in the status of the LED lamp.

If a search through an array of exposed and unexposed cells is desired, as long as the exposure line 218 is kept low the pattern will not be altered. This feature is important for preventing double exposures when doing mixed formats on the same film.

The reset line 219 in FIG. 11, upon receipt of a high going pulse, returns all flip-flops 227 to reset status, thereby extinguishing all of the LEDs.

Those skilled in the art will appreciate that the format display just described, besides being useable in a gamma camera system, has broad applicability to other image systems such as in thermographic imaging, ultrasonic imaging and computerized tomography and x-ray photospot imaging and others.

Another aspect of the system is a circuit which enables the operator to correct the CRT for brightness loss from aging and to maintain absolute control over exposure or film density. The circuitry for both of these functions is shown in FIG. 12.

To calibrate, a standard dot pattern is displayed on the screen of the CRT. This is accomplished by applying current signals, of any suitable waveforms such as triangular, sinusoidal or sawtooth, of different frequencies to the $x$ and $y$ amplifier inputs as in FIG. 5 and, hence, to the $x$ and $y$ deflection coils simultaneously while the gamma camera signals are off and the system is in a calibration mode. A train of high constant frequency pulses are generated for controlling the $z$ pulses to turn the tube on and off at a fixed rate during the sweep so the dot pattern will be developed essentially randomly in time but with rather uniform dot distribution.

Figure 12:
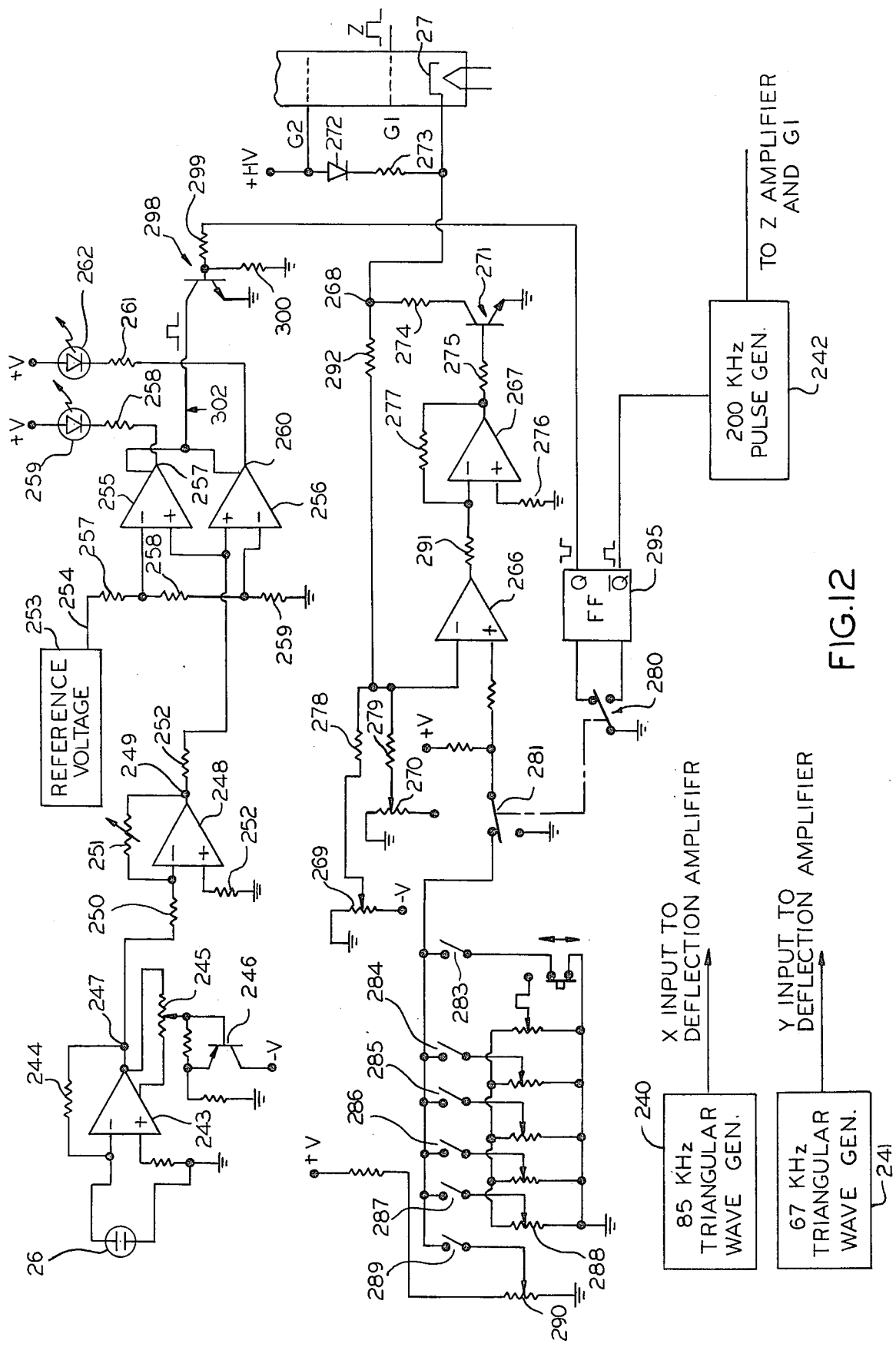
FIG. 12 is a diagram of a CRT intensity control and calibration circuit.

In this example, triangular wave generators 240 and 241 are used and are shown in FIG. 12. They must have substantially different frequencies and should not beat at some low frequency. Just by way of example, generator 240 may have a frequency of 85kHz and generator 241 may have a frequency of 67kHz. The pulse generator for simulating $z$ pulses is marked 242 in FIG. 12. It is a stable crystal controlled oscillator driving a multivibrator which produces a standard square output pulse train of proper pulse duration and by way of example has a pulse rate of 200kHz and a pulse duration of 150 nanosecond. Its output goes to the $z$ signal amplifiers and ultimately to CRT control grid G1. These signals are supplied to the CRT in place of gamma camera signals to produce a known image. In any event, it is desirable to simulate the random dot pattern comparable in all respects with the signals normally produced by the gamma camera.

The calibration pattern or any pattern on the CRT screen is sensed by a light sensor 26 in FIG. 12 and which is located in front of the screen as previously mentioned when discussing FIG. 1. When used in a short circuit mode, this sensor 26 produces a current (linear proportion) corresponding with the brightness of the image on the screen. This current is converted to a voltage signal in a high quality stable high input impedance amplifier 243 which in one commercial model is a Burr-Brown type 3521K. The amplifier has a high resistance feedback resistor 244 and a potentiometer 245 for adjusting input offset. The potentiometer connects to minus supply through a transistor 246 which provides temperature compensated offset adjustment.

The amplified negative signal from output 247 is supplied to the inverting terminal of an amplifier 248 which has some voltage gain to its output 249. Amplifier 248 has an input resistor 250, a feedback resistor 251 and a resistor from its noninverting input to ground. A stable reference voltage is supplied from a conventional source 253 to a junction point 254. These signals are compared by an upper limit comparator 255 and a lower limit comparator 256 which operate like a discriminator or window comparator to inhibit signals from output 249 to either polarity which are outside of the limits and to pass signals within the limits. Thus, the signal from amplifier 248 is supplied to the noninverting inputs of the comparators through resistors and the reference voltage is supplied to the inverting terminals through a balanced divider comprised of resistors 257–259 which set the comparator window opening. Output 257 of comparator amplifier 255 is connected to a resistor 258 which is connected to a lamp means of any suitable kind but may be an LED 259 which connects to positive supply. Similarly, output 260 of comparator amplifier 256 is in series with a resistor 261 and a LED 262 which connects to positive supply. If the sensed signal is between some predetermined lower level and zero, one of the lamps will light. If the signal is above the other comparator the other lamp will go on. If it is above the lower comparator and below the upper comparator both lights are off when comparators 255 and 256 are connected as shown. Observe that if the inverting input of comparator 255 were connected to the point on divider 257–259 where the inverting input of comparator 256 is now connected and if the inverting input of comparator 256 were connected where 255 is now connected, then both lamps would be on if the signal is above the upper and below the lower comparator. Thus, by means which will be described, the operator can turn a calibration knob, which controls CRT intensity, and intensity is adjusted until both LED lamps 259 and 262 are off and the proper original intensity of the CRT is reestablished regardless of any aging of the phosphor screen.

The brightness signal is developed in a circuit that includes two operational amplifiers 266 and 267. Point 268 which is connected to cathode 27 is the point that is actually controlled. The inverting input of amplifier 266 is connected to a coarse adjustment potentiometer 269 and a fine adjustment potentiometer 270 which have summing resistors 278 and 279, respectively, in series. Amplifier 266 drives the inverting terminal of amplifier 267 which, in turn, controls the base bias on transistor 271 so as to regulate or set the intensity voltage at point 268. Amplifier 267 has an input resistor 291 and a feedback resistor 277. Temperature compensating resistor 276 is between the noninverting terminal and ground. A diode 272 and a resistor 273 provide a source of voltage to point 268 from the high voltage supply which may be 400 volts. Resistor 274 limits the low voltage on point 268 so that excess cathode current is not placed on the CRT. The collector and base resistors of transistor 271 are marked 274 and 275, respectively. Resistor 292 in conjunction with resistor 273 limit the upper voltage point of 268 so that the CRT cathode is kept within the design limits of the CRT in the event the amplifier 267 shuts off or transistor 271 fails. Resistor 292 is also the feedback resistor for amplifier 266 that operates around the loop of amplifier 266 and 267 and transistor 271 which form a three part amplifier with a rather high voltage swing.

During calibration the two interlocked single pole switches are transferred to positions alternate to those in which they are shown. During normal operation they are positioned as shown.

The brightness or intensity of the CRT can also be set at predetermined levels after the calibration is set. Sometimes the operators want to run images at a higher or lower intensity or brightness. This is facilitated with a brightness selector comprised of switches 283–289 which each have preset potentiometer such as 288 and 290 in series. Closing the switches selectively will calibrate switch 281 closed as shown, changes the input to the noninverting terminal of amplifier 266 and, hence, 267 and 271 which act as a three part noninverting operational amplifier. Hence, the level of point 268 will change and so will CRT brightness.

LEDs 259 and 262 are inhibited during normal operation, that is, when the system is not in the calibrate mode. During normal operation, switches 280 and 281 are in the position in which they are shown. Switch 280 controls as RS flip-flop 295 so its Q output is high during normal operation. This provides forward bias to transistor 298 by way of resistors 299 and 300. The collector of transistor 298 is then low and this low signal, being applied to line 302, causes the outputs of both comparators to stay high. This reverse biases both LEDs 259 and 262, causing them to remain dark.

In the calibrate mode switches 281 and 280 are transferred from their illustrated positions. Thus, switch 281 isolates the brightness control potentiometers 288. Transfer of switch 280 causes the Q output of flip-flop 295 to go low. Transistor 298 then turns off and its collector goes high. This makes line 302 high and comparators 255 and 266 can function in their normal way during calibration, that is, they can exercise control of conduction by the LEDs 259 and 262 as discussed earlier.

We claim:

1. A system having scintillation camera means for producing electric signals corresponding to the $x$ and $y$ coordinates of scintillations caused by nuclear particles or other radiation being detected by the camera means and for producing electric signals, called $z$ signals, corresponding to detected signals which have desired amplitudes and are coincident with said $x$ and $y$ coordinate signals, comprising:

a cathode ray tube including an electron emissive cathode, an anode, a phosphor screen, electromagnetic deflection coil means for deflecting the electron beam from said cathode on said screen in $x$ and $y$ directions, respectively, a first control electrode to which a voltage signal is applied for selectively turning on said beam, electrostatic focusing means including an electrode to which a voltage signal is applied for focusing the beam on the screen, first and second deflection signal amplifier means each having a high slew rate and each having input and output means, said input means being for receiving signals corresponding with $x$ and $y$ coordinate signals, said input means of said respective deflection amplifier means including a first amplifier stage for impedance matching having an input for a voltage signal corresponding with one of said coordinate signals and having an output, a second amplifier stage for amplifying the voltage signal from said last named output and having an output for the amplified voltage signal, emitter follower buffer third amplifier means having a single ended input for receiving the signals from said second amplifier stage output and having a double ended output, fourth amplifier means comprising, respectively, a complementary pair of NPN transistors and PNP transistors each having an emitter, a collector and a base, the bases of said transistors being connected to the respective ones of said double ended outputs, and a positive supply voltage terminal having the collector of said NPN transistor connected thereto, and a negative supply voltage terminal having the collector of said PNP transistor connected thereto said collectors, respectively, serving as output means for said transistors, fifth amplifier means comprising at least one complementary pair of PNP and NPN transistors, each transistor having an emitter, a collector and a base, bases of said PNP transistors being connected with the output of said fourth stage and bases of said NPN transistors being connected with the output of said fourth stage, a positive supply voltage terminal having the emitters of said PNP transistors connected thereto, a negative supply voltage terminal having the emitters of said NPN transistors connected thereto, an output current terminal having the collectors of all of said PNP and NPN transistors connected thereto, said output current terminal being for coupling with a deflection coil, and means for coupling signals corresponding with said $z$ signals to said first control electrode means for turning on said beam in correspondence with the $x$ and $y$ coordinate signals with which said $z$ signal is substantially coincident.

2. A system having scintillation camera means for producing electric signals corresponding to the $x$ and $y$ coordinates of scintillations caused by nuclear particles or other radiation being detected by the camera means and for producing electric signals, called $z$ signals, corresponding to detected signals which have desired amplitudes and are coincident with said $x$ and $y$ coordinate signals, comprising:

a cathode ray tube including an electron emissive cathode, an anode, a phosphor screen, electromagnetic deflection coils means for deflecting the electron beam from said cathode on said screen in $x$ and $y$ directions, respectively, a first control electrode to which a voltage signal is applied for selectively turning on said beam, focusing means responsive to a control signal by producing a field which affects the focus of the beam in accordance with the amplitude of the control signal, first and second deflection signal amplifier means each having input and output means, said input means being for receiving signals corresponding with $x$ and $y$ coordinate signals and said output means producing current signals corresponding with said $x$ and $y$ coordinate signals, said output means being coupled to said deflection means, respectively, and means for coupling signals corresponding with said $z$ signals to said first control electrode means for turning on said beam in correspondence with the $x$ and $y$ coordinate signals with which said $z$ signal is substantially coincident, means for producing signals respectively corresponding with current flow through said $x$ and $y$ deflection coils, first differentiator means having an input for signals corresponding with flow through the $x$ deflection coils, second differentiator means having an input for signals corresponding with flow through the $y$ deflection coils, first and second absolute value circuit means for converting signals from corresponding respective differentiator means to absolute values of the differentiated signals, comparator means having an input for a reference signal and an input for the sum of said absolute value signals and having an output, said comparator means having a first output state when said summed signal corresponds with said reference signal and a second output state in the absence of correspondence due to the absence of at least one of said signals which correspond to said current flow, controllable means for supplying signals corresponding to said $z$ signals to said first control electrode of the cathode ray tube, said controllable means being responsive to the second state of the comparator means by interrupting said $z$ signals to thereby prevent turning on of said electron beam.

3. In a system having scintillation camera means for producing electric signals corresponding to the $x$ and $y$ coordinates of scintillations caused by nuclear particles or other radiation being detected by the camera means and for producing electric signals, called $z$ signals, corresponding to detected signals which have desired amplitudes and are coincident with said $x$ and $y$ coordinate signals:

a cathode ray tube including an electron emissive cathode, a phosphor screen, means for deflecting the electron beam from said cathode on said screen in $x$ and $y$ directions, respectively, a control electrode to which $z$ signals are applied for selectively turning on said beam and, focusing means to which a signal is applied for focusing said beam, first and second deflection signal amplifier means each having input and output means, said output means being coupled to said beam deflecting means, means for adding offset signal components to said $x$ and $y$ coordinate signals, respectively, means for correcting the focus of said beam in proportion to the radial distance of said beam from the center of said screen, said focus correcting means comprising:

means for producing a first voltage signal which when applied to said electrostatic focusing electrode focuses said beam when it is substantially at the center of said screen, means for producing a second signal proportional to the square root of the sum of the squares of signals corresponding with the signals that are supplied to said inputs, respectively, of said first and second amplifier means, which when said second signal is applied to said electrostatic focusing electrode focuses said beam at the radial distance of the coordinates of the beam determined by the signals that are supplied to said amplifier means, means for continuously combining said first and second signals, and means for coupling said combined signals to said focusing electrode means.

4. A system having scintillation camera means for producing electric signals corresponding to the x and y coordinates of scintillations caused by nuclear particles or other radiation being detected by the camera means and for producing electric signals, called z signals, corresponding to detected signals which have desired amplitudes and are coincident with said x and y coordinate signals, comprising:

a cathode ray tube having an electron emissive cathode, an anode, a phosphor screen, electromagnetic deflection coil means for deflecting the electron beam from said cathode on said screen in x and y directions, respectively, deflection signal amplifier means for receiving signals corresponding with said x and y coordinate signals to drive said deflection coil means, a first control electrode to which a voltage signal is applied for selectively turning on said beam and, focusing means responsive to a control signal by producing a field which affects the focus of the beam in accordance with the amplitude of the control signal, means for combining an offset component with the signal for each coordinate that is supplied to said inputs of said deflection amplifier means, respectively, means for correcting the focus of said beam in proportion to the radial distance of said beam focal point from the center of said screen, said focus correcting means including, means for producing a first signal which when applied to said focusing means focuses said beam when it is substantially at the center of said screen, means for producing a second signal proportional to the square root of the sum of the squares of signals corresponding with the signals that drive said amplifier means, which when said second signal is applied to said focusing means focuses said beam at the radial distance of the coordinates of the beam determined by the signals that are supplied to said amplifier means, means for continuously combining said first and second signals, and means for coupling said combined signals to said focusing means.

5. In a system having scintillation camera means for producing electric signals corresponding to the x and y coordinates of scintillations caused by nuclear particles or other radiation being detected by the camera means and for producing electric signals, called z signals, corresponding to detected signals which have desired amplitudes and are coincident with said x and y coordinate signals:

a cathode ray tube including an electron emissive cathode, a phosphor screen, means for deflecting the electron beam from said cathode on said screen in x and y directions, respectively, a control electrode to which z signals are applied for selectively turning on said beam and, focusing means to which a signal is applied for focusing said beam, first and second deflection signal amplifier means each having input and output means, said output means being coupled to said beam deflecting means, and means for correcting said cathode ray tube for loss of sensitivity and brightness, said means comprising:

means for producing waveforms of different frequencies, one of said means being coupled with said x deflection coils and the other being coupled with said y deflection coils to thereby deflect said CRT beam in a random criss-cross pattern on said screen in the same areas in which images are produced in normal operation, a fixed rate pulse generator simultaneously generating simulated z pulses that are coupled to said control electrode means to thereby turn said beam on and off and develop a test image having a substantially uniform pattern on said screen, a light sensor spaced from said screen and producing an output signal whose amplitude depends on the light intensity of the pattern on the screen in the same areas in which images are produced in normal operation, means for amplifying the output signal from said sensor, said amplifying means including gain control means, a reference voltage source, upper and lower limit comparator means each having an input for said reference voltage and an input for said amplified signal, each of said comparator means having an output terminal and a circuit including a lamp means connected thereto, respectively, one of said comparator means responding to said sensed signal being above said reference signal by tripping and causing the lamp means in its said circuit to light, the other of said comparator means responding to said signal being below said reference signal by tripping and causing the lamp means in its said circuit to light, said comparator means responding to the difference between said reference signal and said amplified signal being between limits by not tripping so that neither of said lamp means will light, the gain of said amplifier means being adjusted initially when said tube is new so that neither of said lamp means are lit when said test image is on said screen, means for developing an adjustable control voltage signal and means for coupling said signal to the cathode of said cathode ray tube for controlling the voltage thereon in respect to said second control electrode to thereby control the electron beam intensity and the brightness of said tube, adjustment of said control voltage to set the brightness of said tubes until both lamp means associated with said comparator means go out indicating that the brightness is substantially the same as it was initially.

6. The system as in claim 5 wherein:

said means for controlling the voltage on said tube cathode comprises amplifier means whose output is coupled to said cathode, said amplifier means having gain control means for establishing the brightness of said tube when a test image is on said screen, a plurality of resistors and means for selectively connecting said resistors to said last named amplifier means to change the gain thereof and thereby afford control over the brightness of said tube during normal operation of said tube when said test pattern is not being produced, and switch means for disconnecting all of said resistors from said amplifier means during production of said test pattern.

7. In a system having scintillation camera means for producing electric signals corresponding to the x and y coordinates of scintillations caused by nuclear particles or other radiation being detected by the camera means and for producing electric signals, called z signals, corresponding to detected signals which have desired amplitudes and are coincident with said x and y coordinate signals:
- a cathode ray tube including an electron emissive cathode, a phosphor screen, means for deflecting the electron beam from said cathode on said screen in x and y directions, respectively, a control electrode to which z signals are applied for selectively turning on said beam and, focusing means to which a signal is applied for focusing said beam,
- first and second deflection signal amplifier means each having input and output means, said output means being coupled to said beam deflecting means, and
- means for correcting said cathode ray tube for loss of sensitivity and brightness, said means comprising:
- means for producing waveforms of different frequencies, one of said means being coupled with said x deflection means and the other being coupled with said y deflection means to thereby deflect said CRT beam in a random criss-cross pattern on said screen in the same areas in which images are produced in normal operation,
- a fixed rate pulse generator simultaneously generating simulated z pulses that are coupled to said first control electrode means to thereby turn said beam on and off and develop a test image having a substantially uniform pattern on said screen,
- a light sensor spaced from said screen and producing an output signal whose amplitude depends on the light intensity of the pattern on the screen in the same areas in which images are produced in normal operation,
- means for amplifying the output signal from said sensor, said amplifying means including gain control means,
- a reference voltage source,
- upper and lower limit comparator means each having an input for said reference voltage and an input for said amplified signal, each of said comparator means having an output terminal and a circuit including a lamp means connected thereto, respectively, one of said comparator means responding to said amplified sensed signal being no greater than said reference signal by causing the lamp means in its said circuit to light, the other of said comparator means responding to said signal not being below said reference signal by causing the lamp means in its said circuit to light, said comparator means responding to the difference between said reference signal and said amplified signal being between limits by causing both of said lamp means to remain lighted, the gain of said amplifier means being adjusted initially when said tube is new so that both of said lamp means are lighted when said test image is on said screen.
- means for developing an adjustable control voltage signal and means for coupling said signal to the cathode of said cathode ray tube for controlling the voltage thereon in respect to said second control electrode to thereby control the electron beam intensity and the brightness of said tube, adjustment of said control voltage to set the brightness of said tubes until both lamp means associated with said comparator means go on indicatng that the brightness is substantially the same as it was initially.

8. The system as in claim 7 wherein:
- said means for controlling the voltage on said tube cathode comprises amplifier means whose output is coupled to said cathode, said amplifier means having gain control means for establishing the brightness of said tube when a test image is on said screen,
- a plurality of resistors and means for selectively connecting said resistors to said last named amplifier means to change the gain thereof and thereby afford control over the brightness of said tube during normal operation of said tube when said test pattern is not being produced, and
- switch means for disconnecting all of said resistors from said amplifier means during production of said test pattern.

9. In a system having scintillation camera means for producing electric signals corresponding to the x and y coordinates of scintillations caused by nuclear particles or other radiation being detected by the camera means and for producing electric signals, called z signals, corresponding to detected signals which have desired amplitudes and are coincident with said x and y coordinate signals:
- a cathode ray tube including an electron emissive cathode, a phosphor screen, means for deflecting the electron beam from said cathode on said screen in x and y directions, respectively, a control electrode to which z signals are applied for selectively turning on said beam and, focusing means to which a signal is applied for focusing said beam,
- first and second deflection signal amplifier means each having input and output means, said output means being coupled to said beam deflecting means,
- means for enabling images to be presented on said screen in desired locations and sizes, comprising:
- first read-only memory means each having input and output means and responsive to selected signals to their input means to produce binary signals on their output means corresponding respectively with the x and y offset of each image location to be displayed on said screen,
- digital-to-analog converter means for converting said binary signals respectively to corresponding analog signals,
- second read-only memory means having input and output means and respectively responsive to selected signals on their input means to produce binary output signals on their output means corresponding with the x and y sizes of the image to be displayed on said screen,
- means controlled by said output signals of said second read-only memory means respectively for selectively attenuating and amplifying coordinate signals from said camera means and for producing analog output signals corresponding respectively with said x and y sizes,
- means for summing said x and y offset analog signals respectively with said analog signals corresponding with said x and y sizes, and
- means for coupling said summed signals respectively to said input means of said deflection amplifier means.

10. The system as in claim 9 including:
- a dual multiple voltage programmable d-c power supply having opposite polarity output terminals, programmer means for controlling said d-c power supply to produce output voltages corresponding with the amplitude of the coordinate signals supplied to said deflection amplifier means, respectively, said deflection amplifier means having opposite polarity power input terminals connected to corresponding output terminals of said d-c power supply.

11. In a system wherein an image is displayed on the screen of a cathode ray tube for being photographed, means for correcting said cathode ray tube for loss of brightness and sensitivity due to aging of said tube, comprising:

a cathode ray tube including an electron emissive cathode, an anode, a phosphor screen, means for deflecting the electron beam from said cathode in $x$ and $y$ directions on said screen, and a first control electrode to which a voltage signal is applied for selectively turning on said beam, means for producing waveforms of different frequencies, one of said means being coupled with said $x$ deflection means and the other being coupled with said $y$ deflection means to thereby deflect said CRT beam in random criss-cross pattern on said screen in the same areas in which images are produced in normal operation, a fixed rate pulse generator simultaneously generating simulated electric pulses that are coupled to said first control electrode means to thereby turn said beam on and off and develop a test image having a substantially uniform pattern on said screen, a light sensor spaced from said screen and producing an output signal whose amplitude depends on the light intensity of the pattern on the screen in the same areas in which images are produced in normal operation, means for amplifying the output signal from said sensor, said amplifying means including gain control means, a reference voltage source, upper and lower limit comparator means each having an input for said reference voltage and an input for said amplified signal, each of said comparator means having an output terminal and a circuit including a lamp means connected thereto, respectively, said comparator means responding to the absence of a substantial difference between said reference signal and said amplified signal by maintaining both of said lamp means in the same state, the gain of said amplifier means being adjusted initially when said tube is new so that both of said lamp means are in the same state when said test image is on said screen, means for developing an adjustable control voltage signal and means for coupling said signal to the cathode of said cathode ray tube for controlling the voltage thereon to thereby control the electron beam intensity and the brightness of said tube, adjustment of said control voltage to set the brightness of said tubes until both lamp means associated with said comparator means in the same state indicating that the brightness is substantially the same as it was initially.

12. The system as in claim 11 wherein:

said means for controlling the voltage on said tube cathode comprising amplifier means whose output is coupled to said cathode, said amplifier means having gain control means for establishing the brightness of said tube when a test image is on said screen, a plurality of resistors and means for selectively connecting said resistors to said last named amplifier means to change the gain thereof and thereby afford control over the brightness of said tube during normal operation of said tube when said test pattern is not being produced, and switch means for disconnecting all of said resistors from said amplifier means during production of said test pattern.

13. In a system comprising a cathode ray tube having a screen for displaying one or a sequence of images in a selected format, means for producing electric signals representative of the sizes of the respective images desired on the screen, means for producing electric address signals representative of the $x$ and $y$ coordinates or location of images in the format on the screen, means for controlling said tube to produce an image of the selected size and at the address determined by said signals, means for recording selected images in correspondence with their occurrence on the screen, and improved display means for indicating the status of the format, said display means comprising:

an array of indicator lamp means associated respectively with individual addressable areas on said screen, control means for maintaining said lamps, respectively, in one of a plurality of states, said control means having input means for both $x$ and $y$ address signals corresponding with address signals controlling said tube, said control means having means responsive to the presence of said address signals by maintaining said lamp means in one state, and means responsive to simultaneous presence of said address signals andd a signal corresponding with exposure of said area being in progress for maintaining said lamp means in another state, and means responsive to termination of said exposure signal by maintaining said lamp means in still another state, and resetting means for restoring all of said lamp means to a single state.

14. In a system comprising a cathode ray tube having a screen for displaying one or a sequence of images in a selected format, means for producing electric signals representative of the sizes of the respective images desired on the screen, means for producing electric address signals representative of the $x$ and $y$ coordinates or location of images in the format on the screen, means for controlling said tube to produce an image of the selected size and at the address determined by said signals, means for recording selected images in correspondence with their occurrence on the screen, and improved display means for indicating the status of the format, said display means comprising:

an array of indicator lamp means associated respectively with individual addressable areas on said screen, control means for maintaining said lamps, respectively, in one of a plurality of states, said control means having input means for both $x$ and $y$ address signals corresponding with address signals controlling said tube, said control means having means responsive to concurrent conditions of an area not being addressed and not having been exposed by maintaining said lamp means in a first state, and means responsive to the presence of said address signals by maintaining said lamp means in a second state, and means responsive to simultaneous presence of said address signals and a signal corresponding with exposure of said area being in progress for maintaining said lamp means in a third state, and means responsive to termination of said exposure signal by maintaining said lamp means a fourth state, and resetting means for restoring all of said lamp means to a single state.

15. The system as in claim 14 wherein:

said input means of each of said control means includes first gate means for providing an output signal in response to the presence of both coordinate signals, second gate means having an input for said last named output signal and an input for a pulse train wherein the duration of the pulses are substantially different than the time intervals between them, said second gate means having an output and being enabled to pass pulses by the output of said first gate means, third exclusive OR gate means having at least two inputs one of which is coupled to the output of said second gate means and having an output coupled to said lamp means said lamp means thereby being caused to blink with an on and off time corresponding with one and another of the pulse durations and the intervals between them, flip-flop means having an output coupled with another of the inputs to said exclusive OR gate means, means responsive to the presence of an exposure signal during the said simultaneous presence of said address signals by causing said flip-flop means to change its output state and thereby cause said exclusive OR gate to blink with an off and on time corresponding with the complement of said pulse durations and the intervals between them.

16. In a system comprising means for displaying images in selected formats, on a screen means for generating digital signals representative of the sizes of the images and of the $x$ and $y$ coordinates of the images on the screen and means responsive to said signals by controlling said image displaying means to display images in said format; and, improved means for indicating the status of the format, comprising:

an array of indicator lamp means arranged in adjacent rows which thereby result in a sequence of columns of lamp means being formed, each of said lamp means being associated with an individual imaging area on said screen, a plurality of cells, one for each of said lamp means, a plurality of control lines for $x$ coordinate digital signals corresponding with the signals that determine the $x$ coordinates of the selected image areas, said control lines being coupled to the cells in the columns, respectively, a plurality of control lines for $y$ coordinate digital signals corresponding with the signals that determine the $y$ coordinates of the selected image areas, said last named control lines being coupled to the cells in the rows, respectively, means in each of said cells that are selectively responsive to concurrent conditions of the absence of $x$ and $y$ coordinate signals corresponding with an area and to that area not having been exposed by maintaining said lamp means in a first state, and responsive to the simultaneous presence of $x$ and $y$ coordinate signals by maintaining said lamp means in a second state, and responsive to the simultaneous presence of said $x$ and $y$ coordinate signals and a signal corresponding with exposure of the area to which said lamps relate by maintaining said lamp means in a third state, and responsive to termination of said exposure signal by maintaining said lamp means in a fourth state, and resetting means for restoring all of said lamp means to a single state.

17. The system as in claim 16 wherein said cells are further defined as comprising:

first gate means having inputs coupled with said $x$ and $y$ control signal lines, respectively, and responsive to produce an output signal when said $x$ and $y$ coordinate signals are present simultaneously, second gate means having an input for a pulse train wherein the durations of the pulses are substantially different than the intervals between them and having another input for the output signal from said first gate means such that said output signal will enable said second gate means to pass said pulses, exclusive OR gate means having an output in circuit with said lamp means which output when in one state causes said lamp means to turn on and when in its other state causes said lamp means to turn off, said exclusive OR gate means having a first input coupled with the output of said first gate means and having a second input for signals having high and low states, switching means for selectively producing respectively high and low state control signals, said switching means having an output coupled to said second input of said exclusive OR gate means such that when said second input is in one state said exclusive OR gate output will be in said one state for the duration of said pulses and such that when said second input is in its other state said exclusive OR gate output will be in its other state during the intervals between said pulses, and means responsive to the simultaneous presence of an exposure signal and said output signal from said first gate means by changing the output state of said switching means, discontinuance of said exposure signal and said $x$ and $y$ coordinate signals causing said switching means to latch in its last named state and to interrupt said pulses to said exclusive OR gate so that its output state is continuous to thereby maintain said lamp means in said fourth and steady state.

18. The system as in claim 16 wherein said cells are further defined as comprising:

an exclusive OR gate having an output and a circuit including said lamp means connected thereto, said gate being characterized by having first and second inputs and an output which is high when one or the other of said inputs is high and which is low when both of said inputs are either high or low, flip-flop means having set and reset inputs and an output which is coupled with said first input of said exclusive OR gate and which output is in a high state when said set input is low and which is in a low state when said set input is high, a first NAND gate having first and second inputs and an output coupled to said second input of said exclusive OR gate, said first input being coupled with a source of a signal for enabling said NAND gate and said second input being for receiving a train of pulses wherein the duration of the pulses are substantially shorter than the intervals between them, an AND gate having first and second inputs and an output and responsive to the simultaneous presence of $x$ and $y$ coordinate signals on its inputs, respectively, by producing said enabling signal for said first NAND gate to pass pulses to said second input of said exclusive OR gate means, a second NAND gate having an output coupled with the set input of said flip-flop means and having first and second inputs, said first input being coupled to the output providing said enabling signal from said AND gate and said second input being for receiving a high going exposure signal when an exposure is initiated, said $x$ and $y$ coordinate signals when present controlling said second NAND gate to in turn control said set input of said flip-flop means so its output is in a low state where pulses will be coupled through said exclusive OR gate to cause said lamp means to blink with an one time corresponding with the short pulse durations and an off time corresponding with the intervals between pulses, said exposure signal causing the output of said second NAND gate to change state if said $x$ and $y$ coordinate signals are present to thereby said flip-flop output to a high state whereby pulses will be coupled through said exclusive OR gate to cause said lamp means to blink with an off time corresponding with said short during pulses and an on time corresponding with the intervals between said pulses.

discontinuance of said $x$ and $y$ coordinate signals and said exposure causing such first NAND gate means to be disabled and said flip-flop means output to remain set in its high state to thereby maintain said output of said exclusive OR gate continuously in its low state to keep said lamp means on.

* * * * *